United States Patent
Trautman

(10) Patent No.: US 8,587,944 B2
(45) Date of Patent: Nov. 19, 2013

(54) MULTI-LAYER MESH WICKS FOR HEAT PIPES

(75) Inventor: Mark A. Trautman, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 1239 days.

(21) Appl. No.: 12/416,354

(22) Filed: Apr. 1, 2009

(65) Prior Publication Data
US 2010/0254090 A1    Oct. 7, 2010

(51) Int. Cl.
  *H05K 7/20*    (2006.01)
  *F28D 15/00*   (2006.01)
(52) U.S. Cl.
  USPC ..................... 361/700; 165/104.26
(58) Field of Classification Search
  USPC ..................... 165/104.26; 361/700
  See application file for complete search history.

(56) References Cited

U.S. PATENT DOCUMENTS

| | | | |
|---|---|---|---|
| 2,009,865 A * | 7/1935 | Weaver | 431/325 |
| 3,490,718 A * | 1/1970 | Vary | 244/171.8 |
| 3,604,504 A | 9/1971 | Kessler, Jr. et al. | |
| 3,681,843 A | 8/1972 | Arcella et al. | |
| 4,003,427 A | 1/1977 | Leinoff et al. | |
| 4,304,738 A * | 12/1981 | Nutter | 261/94 |
| 4,489,777 A * | 12/1984 | Del Bagno et al. | 165/104.26 |
| 5,076,352 A | 12/1991 | Rosenfeld et al. | |
| 7,367,383 B2 | 5/2008 | Li et al. | |
| 2001/0004934 A1* | 6/2001 | Yamamoto et al. | 165/104.11 |
| 2004/0069460 A1* | 4/2004 | Sasaki et al. | 165/104.26 |
| 2006/0169439 A1* | 8/2006 | Hong et al. | 165/104.26 |
| 2006/0213061 A1* | 9/2006 | Wu et al. | 29/890.032 |
| 2006/0260786 A1 | 11/2006 | Hsu | |
| 2007/0163755 A1* | 7/2007 | Kim et al. | 165/104.26 |
| 2007/0295486 A1* | 12/2007 | Su et al. | 165/104.26 |
| 2010/0157533 A1* | 6/2010 | Oniki et al. | 361/700 |

* cited by examiner

*Primary Examiner* — Allen Flanigan
*Assistant Examiner* — Jason Thompson
(74) *Attorney, Agent, or Firm* — Fox Rothschild, LLP; Robert J. Sacco

(57) ABSTRACT

Heat pipe (400) includes a heat pipe body (402) having an inner cavity (408), and a wick structure (404) disposed in the inner cavity. The wick structure includes a first woven mesh layer (410) and a second woven mesh layer (412) disposed on the first woven mesh layer. The first woven mesh layer is a first weave pattern of thermally conductive fibers (103) having a first warp direction (W3 or W4) and the second woven mesh layer is a second weave pattern of thermally conductive fibers (105) having a second warp direction (W5 or W6). The second woven mesh layer is disposed on the first woven mesh layer such that the first and the second warp directions are rotationally offset by an inter-layer warp offset angle ($\gamma_i$).

7 Claims, 6 Drawing Sheets

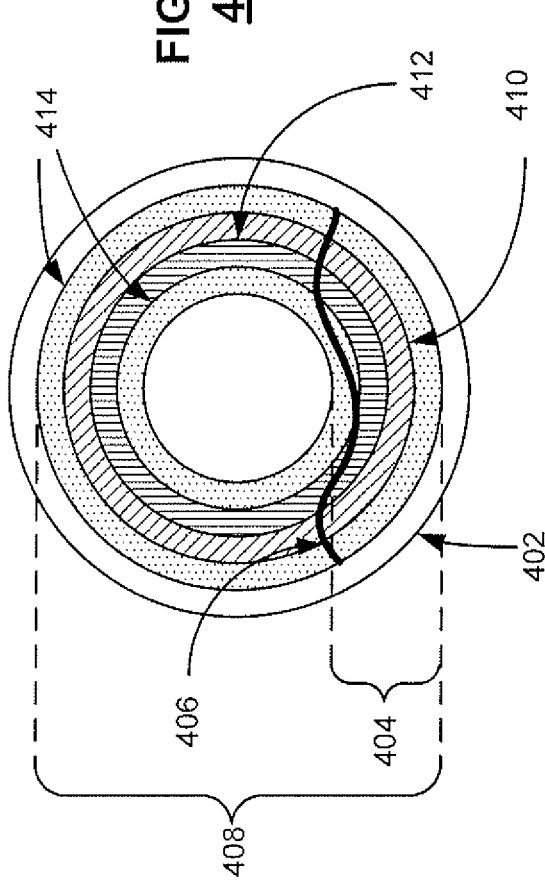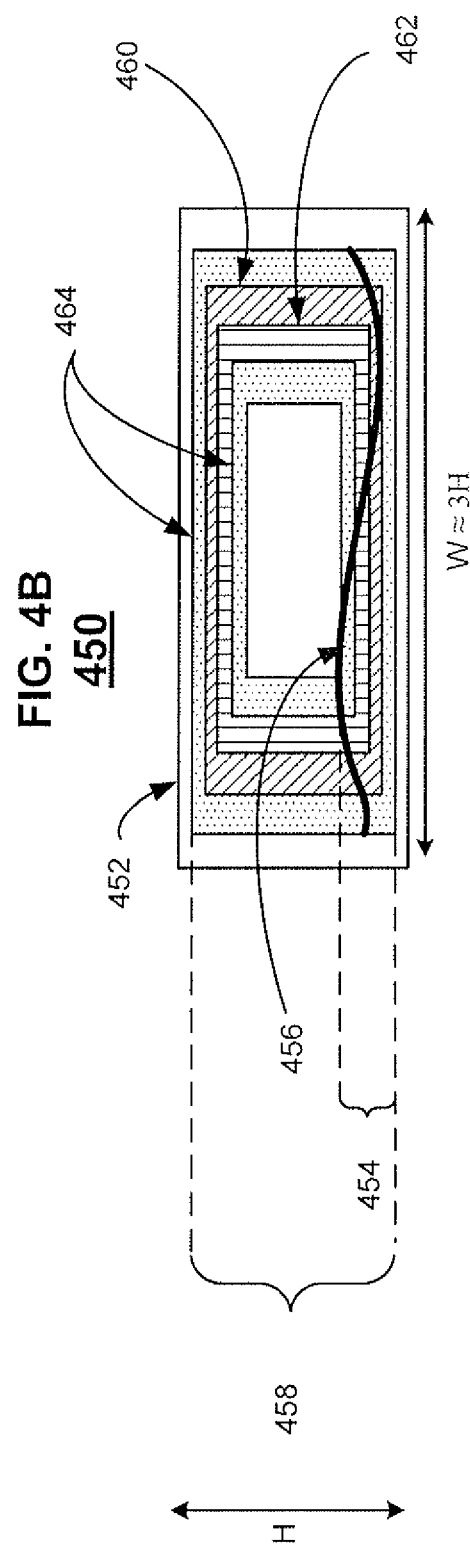

600

650

MULTI-LAYER MESH WICKS FOR HEAT PIPES

BACKGROUND OF THE INVENTION

1. Statement of the Technical Field

The invention is directed to heat pipes, and more particularly to multi-layer mesh wicks for heat pipes.

2. Description of the Related Art

Heat pipes are typically sealed, evacuated devices that transfer heat by evaporation and condensation of a working fluid. They are typically passive devices which require no external power for their operation. Conventional heat pipes generally operate by the introduction of heat into an evaporator section, which is usually located at one end of the heat pipe, where the introduced heat evaporates some of the working fluid. This increases the vapor pressure in the evaporator section and causes vapor to flow through the vapor space of the heat pipe towards a condenser section, typically at the other end of the heat pipe. Since the heat pipe is generally set up so that the condenser section is cooler than the evaporator section, the vapor condenses in the condenser section, releasing heat stored in the vapor. The condensed liquid is then returned to the evaporator, typically by capillary action within a wick structure within the heat pipe. Because of their high heat transfer efficiency and general overall simplicity, heat pipes are commonly used in various types of heat transfer applications. For example, heat pipes have been used for removing heat from an electrical circuit without the need for electrical power.

In general, one aspect of heat pipe design is the design of the wick. Typically, the wick is designed so as to provide high values for wick parameters such as thermal conductivity, capillary pumping pressure, and permeability to fluid flow. However, obtaining high values for these wick parameters using conventional methods is typically either economically or technologically impractical. For example, conventional wick technologies which provide high values for these wick parameters, such as sintered particle methods, are typically expensive and therefore economically impractical for many low-cost product applications. In the case of low-cost conventional wick technologies, such as groove and mesh (solid or woven) comprising wicks, a high thermal conductivity is typically difficult to achieve without significant reduction of fluid permeability or capillary pumping pressure.

SUMMARY OF THE INVENTION

Embodiments of the invention provide methods for fabricating heat pipes having multi-layer mesh wicks and heat pipes therefrom. In a first embodiment of the invention, a heat pipe is provided. The heat pipe includes a heat pipe body having an inner cavity and a wick structure disposed in the inner cavity. The wick structure includes a first woven mesh layer and a second woven mesh layer disposed on the first woven mesh layer. In the heat pipe, the first woven mesh layer is a first weave pattern of thermally conductive fibers having a first warp direction and the second woven mesh layer is a second weave pattern of thermally conductive fibers having a second warp direction. Furthermore, the second woven mesh layer is disposed on the first woven mesh layer such that the first and the second warp directions are rotationally offset by inter-layer warp offset angle ($\gamma_i$) greater than 2.5 degrees and less than or equal to 87.5 degrees.

In a second embodiment of the invention, a method of manufacturing a heat pipe is provided. The method includes stacking a plurality of woven mesh layers to form a wick structure and sealing the wick structure and a heat pipe fluid within a hollow heat pipe body. In the method, the plurality of woven mesh layers includes first and second woven mesh layers, where the first woven mesh layer is a first weave pattern of thermally conductive fibers having a first warp direction and the second woven mesh layer is a second weave pattern of thermally conductive fibers having a second warp direction. In the method, the stacking step includes positioning the second woven mesh layer on the first woven mesh layer such that the first and the second warp directions are rotationally offset by an inter-layer warp offset angle ($\gamma_i$) greater than 2.5 degrees and less than 87.5 degrees.

In a third embodiment of the invention, an electronic device is provided. The electronic device includes a substrate in thermal contact with one or more electronic components, a heat pipe body having an inner cavity formed in or on the substrate, and a wick structure disposed in the inner cavity. The wick structure includes at least a first woven mesh layer and at least a second woven mesh layer disposed on the first woven mesh layer. The first woven mesh layer is a first weave pattern of thermally conductive fibers having a first warp direction and the second woven mesh layer is a second weave pattern of thermally conductive fibers having a second warp direction. In the electronic device, the second woven mesh layer is disposed on the first woven mesh layer such that the first and the second warp directions are rotationally offset by a inter-layer warp offset angle ($\gamma_i$) greater than 2.5 degrees and less than or equal to 87.5 degrees.

BRIEF DESCRIPTION OF THE DRAWINGS

FIG. 4A shows a cross-section view of an exemplary circular heat pipe configured according to an embodiment of the invention.

FIG. 4B shows a cross-section view of an exemplary rectangular heat pipe configured according to an embodiment of the invention.

DETAILED DESCRIPTION

Figure 1:
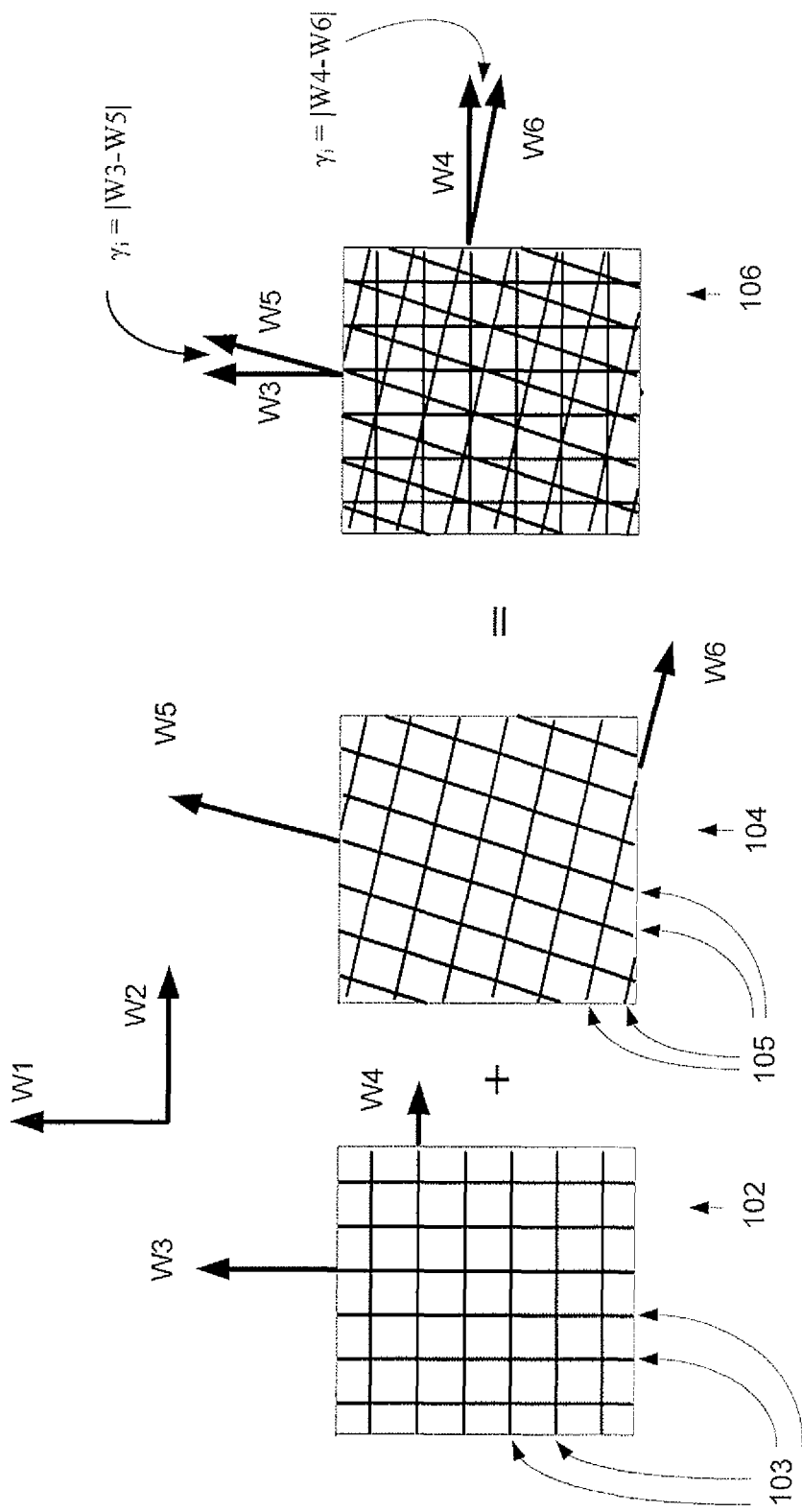
FIG. 1 conceptually illustrates a method of forming a two-layer wick structure in accordance with an embodiment of the invention.

The invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Embodiments of the invention describe methods for forming heat pipes including improved wick structures and heat pipes therefrom. In particular, the improved wick structures comprise multi-layer woven mesh wick structures assembled using offset angles between warp or reference directions of the multiple layers to provide wick structures with high thermal conductivity, high capillary pumping pressure, high permeability to fluid flow, and high stability as compared to wick structures formed with woven mesh layers arranged according to conventional methods.

The term "woven mesh layer", as used herein, refers to any semi-permeable barrier layer comprising a weave pattern of thermally conductive fibers, such as metal, plastic, or any other thermally conductive fibers comprising flexible/ductile materials. The term "weave pattern" as used herein, refers to the way in which the fibers are positioned in a warp direction and how transverse fibers cross over and under the fibers in the warp direction. The term "warp direction" as used herein, generally refers to the direction of the fibers running parallel to a selected reference direction. Although the various embodiments of the invention will be illustrated and described principally in terms of wick structures comprising woven mesh layers formed using plain weave patterns and no crimping, the invention is not limited in this regard. The various embodiments of the invention are equally applicable to wick structures using woven mesh layers having other types of weave patterns and any style of crimping. For example such other types of weave patterns can include twill, Dutch, and heddle patterns, to name a few. Crimping styles can include plain, lock crimp, intermediate crimp, or flat top, to name a few. Additionally, the invention is not limited to the use of square mesh weave patterns, particular fiber diameters, or particular opening sizes. Rather, the various embodiments of the invention are equally applicable to woven mesh layers having square and/or rectangular spacing of any size, varying weave patterns, and varying fiber diameters.

As previously described, one difficulty in providing low-cost wick structures for heat pipes with high thermal conductivity is that low fluid permeability is typically obtained. In a conventional heat pipe including a wick structure based on woven mesh layers, the amount of fluid that can be transported through the wick is typically increased by stacking a plurality woven mesh layers on each other, where the fibers are substantially aligned. That is, the cross sectional area of the wick structure through which fluid flows is increased to provide the greater flow capacity. However, in some cases, a stack of woven mesh layers results in lower fluid permeability. For example, if the stacks collapse into each other. This is typically the result of the woven mesh layers being arranged in a staggered or interlocking configuration. That is, the peaks at a surface of a woven mesh layer are aligned with the valleys at a surface of an adjacent woven mesh layer. In such an arrangement, the spacing between portions of the wick structure comprising material from the woven mesh layers is relatively small, resulting in a relatively smaller amount of the wick structure being available to allow a fluid to flow through the wick structure.

The solution to these problems has generally been to provide a larger amount of porosity in the wick structure. In the case of conventional wick structures comprising woven mesh layers, this has been accomplished by stacking the woven mesh layers such that peaks in one woven mesh layer are aligned with corresponding peaks in an adjacent woven mesh layer. Although the resulting structure allows a greater flow through the wick structures, a peak-to-peak stack of the woven mesh layers is typically less stable than the peak-to-valley stack described above. The instability can result in collapse of the peak-to-peak stack (to a peak-to-valley stack) during sintering or other heat pipe fabrication steps as the woven mesh layers shrink, expand, or otherwise laterally shift.

The term "peak", as used herein with respect to a woven mesh layer, refers to any point of the woven mesh layer in which the thickness is greatest, typically where the fibers in the woven mesh layer intersect or overlap. The term "valley", as used herein with respect to a woven mesh layer, refers to any points of the woven mesh layer in which the thickness is least, typically where fibers in the woven mesh layer do not intersect or overlap, such as in the spacings or openings in the woven mesh layer.

In other conventional wick structures comprising woven mesh layers, increased porosity has been provided by inserting materials between the mesh layers, such as wires or small particles, to increase the spacing between the mesh layers. In some instances, these materials are then removed or are subject to sintering processes to join the mesh layers and the particles. Although such methods may increase porosity and stability (after sintering), the increased spacing between the mesh layers can significantly decrease thermal conductivity. As a result, the performance of such heat pipes is degraded.

In order to overcome the various limitations of conventional wick structures based on woven mesh layers, the various embodiments of the invention provide methods for fabricating heat pipes using multi-layer mesh wick structures and heat pipes therefrom. The resulting heat pipes provide relatively higher fluid permeability and higher resistance to collapse as compared to conventional methods. In particular, the wick structure is fabrication by stacking of woven mesh layers with an inter-layer warp offset angle ($\gamma_i$). This is conceptually illustrated in FIG. 1.

FIG. 1 conceptually illustrates a method of forming an exemplary two-layer wick structure 106 in accordance with an embodiment of the invention. As shown in FIG. 1, the exemplary two-layer wick structure 106 comprises a stacked arrangement of first 102 and second 104 square woven mesh layers. In the various embodiments of the invention, the transverse fibers 103 in the first square woven mesh layer 102 are oriented in directions W3 and W4 with respect to reference directions W1 and W2, respectively. The transverse fibers 105 in the second square woven mesh layer 104 are oriented in directions W5 and W6 with respect to reference directions W1 and W2, respectively, and such that W3≠W5 and W4≠W6. As a result, in the exemplary two-layer wick structure 106, the orientations of the transverse fibers 103, 105 are separated by an angle $\gamma_i = |W3 - W5| = |W4 - W6|$. Such a configuration can be achieved, for example, by providing an offset angle between the fibers 103 in a direction W3 for the first woven mesh layer 102 and the fibers 105 in a direction W5 for the second woven mesh layer 104. That is, the warp directions for the first 102 and second 104 woven mesh layers are selected to be W3 and W5, respectively. Alternatively, fibers 103 in direction W4 and fibers 105 in direction W6 can be offset. That is, the warp directions for the first 102 and second 104 woven mesh layers are selected to be W4 and W6, respectively.

This resulting structure is significantly more resistant to collapse and also provides increased porosity as compared to conventional wick structures using woven mesh layers in a peak-to-valley arrangement. In particular, since the transverse fibers 103, 105 of woven mesh layers 102, 104, respectively are offset by an angle $\gamma_i$, the likelihood that a significant number of peaks formed in the surface of the first woven mesh layer 102 are aligned with valleys formed in the surface of the second woven mesh layer 104 is significantly reduced. As a result, the likelihood that the woven mesh layers will interlock when stacked on each other is significantly reduced and the likelihood of some amount of spacing (i.e., increased porosity) between the woven mesh layers being formed is increased. Similarly, since alignment of peaks and valleys in the woven mesh layers is significantly more difficult to achieve in an arrangement where the woven mesh layers 102, 104 are offset by an angle $\gamma_i$, the likelihood that compression, expansion, or lateral shifts of one or both woven mesh layers 102, 104 results in collapse due to an alignment of peaks and valleys is also significantly reduced.

In the various embodiments of the invention, the offset angle ($\gamma_i$) provided between the adjacent woven mesh layers is greater than 0 degrees and less than 90 degrees. For example, between 2.5 and 87.5 degrees. At 0 and 90 degrees, the transversely arranged fibers in the woven mesh layers are typically substantially aligned, increasing the likelihood of peak-to-valley alignment of the adjacent woven mesh layers and increasing the likelihood of subsequent collapse. Accordingly, as the offset angle between the transverse fibers in the adjacent woven mesh layers is increased, this likelihood is decreased.

In the various embodiments of the invention, any amount of offset is sufficient to reduce the likelihood of collapse and increase the amount of porosity. However, although increased porosity provides the potential for enhanced fluid flow through the wick, fluid flow and heat transfer is generally governed by the amount of compaction in the wick structure, typically characterized by the wick compression factor (cf). That is, any increase in porosity needs to be accompanied by a relatively larger decrease in the amount of compaction in order to enhance performance for the wick structure. The various embodiments of the invention can provide such relatively larger decreases in compaction (i.e., increases in compression factor), as illustrated in FIG. 2.

The term "compression factor", as used herein with respect to woven mesh layers, refers to the ratio of actual thickness of a stack of woven mesh layers to the maximum possible stack thickness for the woven mesh layers. That is, the ratio of the thickness of the current configuration of n woven mesh layers to the thickness of the n woven mesh layers in a peak-to-peak stack configuration without any angle offset, as previously described above. Accordingly, the compression factor is greatest (i.e., =1) when the woven mesh layers are arranged in a peak-to-peak stack and lowest when in a staggered or interlocked (peak-to-valley stack) configuration. The minimum value for the compression factor will be dependent on the configuration of the n layers in the stack and can vary from stack to stack.

Figure 2:
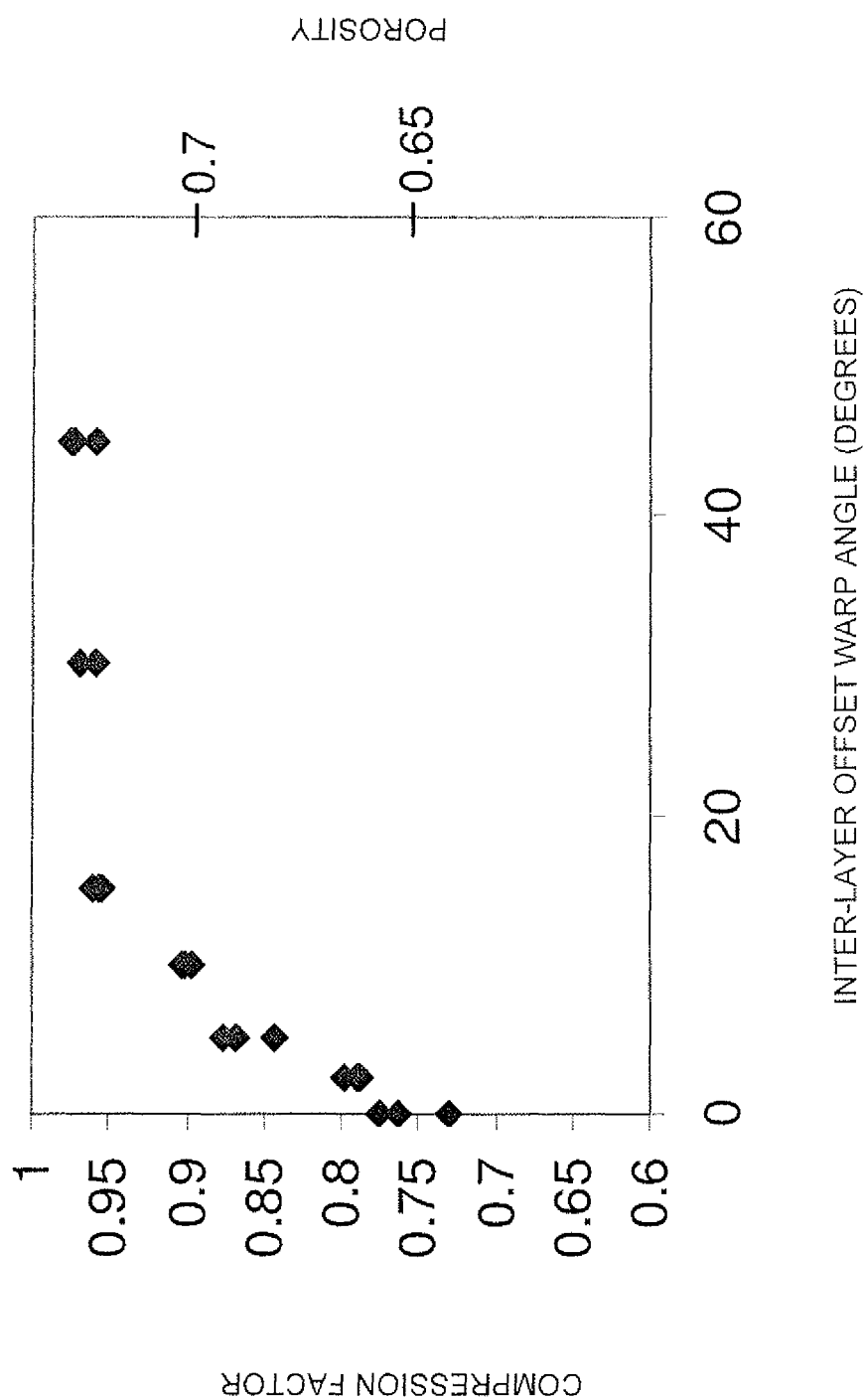
FIG. 2 is a scatter plot of inter-layer warp offset angle ($\gamma_i$) versus compression factor and corresponding porosity for a two-layer wick structure in accordance with an embodiment of the invention.

FIG. 2 is a scatter plot of inter-layer warp offset angle ($\gamma$) versus compression factor and corresponding porosity for a two-layer wick structure formed from woven mesh layers comprising conventional #145 copper square plain weave pattern mesh layers arranged in accordance with an embodiment of the invention. As shown in FIG. 2, as the offset angle ($\gamma_i$) is increased from 0 to 15 degrees, the porosity is increased from ~0.65 to ~0.73, a ~12% increase. As the offset angle ($\gamma_i$) is further increased from 15 to 45 degrees, the porosity remains effectively unchanged. However, even though the porosity is only increased by ~12%, the increase in compression factor is significantly larger. As shown in FIG. 2, as the inter-layer warp offset angle is increased from 0 to 15 degrees, the compression factor is increased from ≤0.75 to ≥0.95, a 25-30% increase in the compression factor. That is, for the configuration used in FIG. 2, the increase in compression factor is approximately 2× or greater than the increase in porosity. Therefore, two-layer wick structures with inter-layer warp offset angles not only provide increased porosity, as in peak-to-peak stack configurations, but also provide reduced compaction. This provides a significant increase in wick flow permeability and thus enhances the fluid flow through the wick structure. For example, for an offset angle of as little as 5 to 10 degrees, a compression factor increase of ~10% can be observed. Therefore, in the various embodiments of the invention, fluid flow can be significantly increased without a significant warp offset angle.

Figure 3:
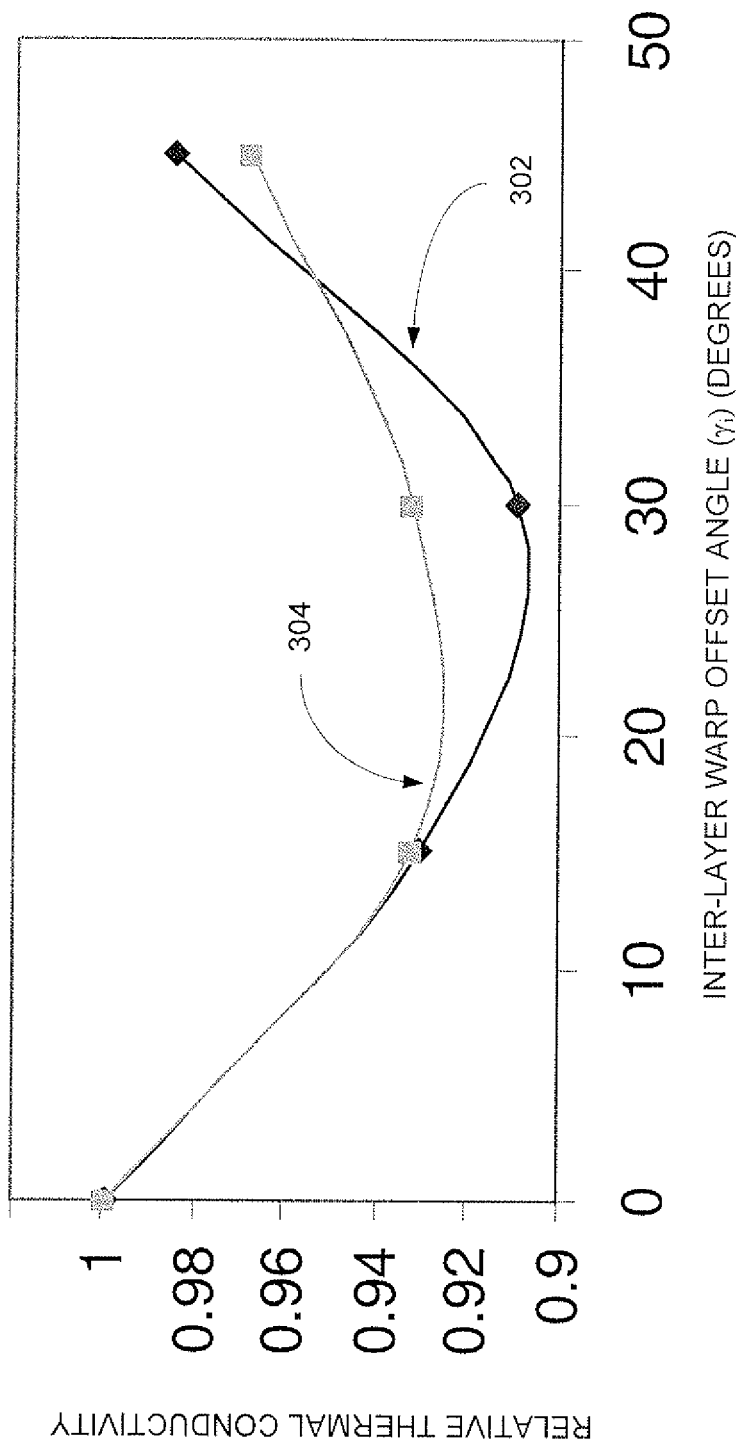
FIG. 3 is an x-y plot of inter-layer warp offset angle ($\gamma_i$) versus relative thermal conductivity for a two-layer and six-layer wick structures in accordance with an embodiment of the invention.

Additionally, the inter-layer warp offset angle ($\gamma_i$) does not significantly affect the amount of thermal conductivity. This is illustrated in FIG. 3. FIG. 3 is a x-y plot of inter-layer warp offset angle ($\gamma_i$) versus relative thermal conductivity for two-layer and six-layer wick structures formed from woven mesh layers comprising conventional #145 copper square plain weave pattern mesh layers and arranged in accordance with an embodiment of the invention. The relative thermal conductivity values in FIG. 3 were normalized to the maximum thermal conductivity arrangement for the two-layer and six-layer wick structures, a stack of woven mesh layers in a peak-to-valley stack configuration without any significant amount of angle offset ($\gamma_i$<2 degrees). As shown in FIG. 3, the relative thermal conductivity of the two-layer wick structure, shown by curve 302 (designated by diamonds) varies by less than 10% as the angle offset is varied from 0 to 45 degrees. The variation in curve 302 is due in large measure to the amount of direct physical contact between the layers. That is, at 0 degrees, the peak-to-valley arrangement provides the greatest amount of physical contact. Between 15 and 30 degrees, the amount of direct physical contact is somewhat reduced, but not sufficient to significantly reduce the thermal conductivity so as to degrade the performance of the heat pipe. At 45 degrees, an improvement in relative thermal conductivity is observed due to the increased amount of contact between the woven mesh layers.

The improved thermal conductivity of the wick structures fabricated in accordance with the various embodiments of the invention is due to the increased thermal contact between the woven mesh layers as compared to conventional wick structures with comparable porosity. In such conventional wicks structures, increased porosity is generally provided by the use of inter-layer materials to separate the woven mesh layers, as described above. As a result, the amount of contact between the woven mesh layers is reduced, reducing the overall thermal conductivity of the wick structure. In contrast, since no materials need to be inserted between the woven mesh layers in the various embodiments of the invention, the amount of contact between these woven mesh layers is significantly higher, providing improved thermal conductivity.

In some embodiments of the invention, the variation in relative thermal conductivity due to inter-layer warp offset angle can be reduced by providing additional woven mesh layers in the wick structure. This is also illustrated in FIG. 3. As shown in FIG. 3, the relative thermal conductivity of a six-layer wick structure, shown by curve 304 (designated by squares), varies by less than ~7% as the angle offset is varied from 0 to 45 degrees. Curve 304 is based on an arrangement of the six woven mesh layer such that the offset angle between any two adjacent layers is substantially the same (within 2 degrees). As in curve 302, the variation in curve 304 is due in large measure to the amount of direct physical contact between the layers. However, between 15 and 30 degrees, even though the amount of direct physical contact is reduced, the reduction in the amount of relative thermal conductivity, as compared to the amount for the two-layer structure shown by curve 302, is significantly less. However, in either case, the relative amount of decrease in thermal conductivity (<10%) is significantly lower than the increase in compression factor (≥25%) for the same range of offset angles.

Although the various exemplary embodiments have been described above as comprising a stack of woven mesh layers having the same weave pattern and having substantially the same offset angle between each pair of adjacent woven mesh layers, the invention is not limited in this regard. In some embodiments, the offset angle for adjacent woven mesh layers in the stack can be different for different pairs of adjacent woven mesh layers (i.e. offset angles $\gamma_1$ and a $\gamma_2$ for different pairs of adjacent layers can be the same or different). Additionally, adjacent woven layers can have different weave patterns. In general, since the woven mesh layers generally comprise a combination of transverse fibers, regardless of the weave pattern being used, an offset angle in accordance with an embodiment of the invention still provides increased porosity and compression factor, resulting in enhanced performance.

The various embodiments of the invention can be used to simplify the heat pipe fabrication process. In general, a heat pipe is fabricated by evacuating a hollow heat pipe body and sealing a wick structure, along with a suitable heat pipe fluid, within an inner cavity of the hollow heat pipe body. This is conceptually shown in FIGS. 4A and 4B. FIG. 4A shows a cross-section view of an exemplary circular heat pipe 400 configured according to an embodiment of the invention. FIG. 4B shows a cross-section view of an exemplary rectangular heat pipe 450 configured according to an embodiment of the invention. FIGS. 4A and 4B are similar with the exception of having different cross-sectional profiles as show. As such, the two figures will be described together in the following discussion.

As shown in FIGS. 4A and 4B, the heat pipes 400, 450 each include a hollow heat pipe body 402, 452, a wick structure 404, 454 and a fluid 406, 456 (prior to any capillary action and not yet dispersed within the wick) disposed in an inner cavity 408, 458 of the heat pipe body. In general, the heat pipe body 402, 452 and the wick structure 404, 454 are formed using thermally conductive materials, such as metals, some glasses and crystalline materials, and some plastic materials, to name a few.

In accordance with an embodiment of the invention, the wick structure 404, 454 can comprise a first woven mesh layer 410, 460 and a second woven mesh layer 412, 462 adjacent to the first woven mesh layer, as shown respectively in FIGS. 4A and 4B. As described above, the first 410, 460 and second 412, 462 woven mesh layers can be stacked such that the warp directions of the woven mesh layers are offset by angle between greater than 0 degrees and less than 90 degrees. In some embodiments of the invention, the wick structure 404, 454 can also comprise one or more additional woven mesh layers 414, 464. In some cases, one or more of the additional woven mesh layers can also be positioned such that the warp directions between adjacent layers are also offset by angle greater than 0 degrees and less than 90 degrees.

The wick structure for a heat pipe in accordance with an embodiment of the invention can be fabricated using various methods. In general, any conventional method suitable for assembling a wick structure using woven mesh layers can be utilized. For example, in some conventional methods, a wick structure can be fabricated by stacking the various woven mesh layers and the stack can be inserted into heat pipe body. In some cases, a sintering or bonding step can be performed prior to inserting the wick structure into a heat pipe body or after inserting in the heat pipe body. In other conventional methods, the wick structure can be fabricated by insertion of the various woven mesh layers individually into the heat pipe body. In some cases a spring can also be inserted into the heat pipe body to secure the woven mesh layers together. Regardless of whether the wick structure is assembled inside or outside of the heat pipe body, in the various embodiments of the invention, an offset angle is provided between the warp directions of the woven mesh layers of interest. One method of ensuring such an offset angle is to provide woven mesh layers such as woven mesh layers 102 and 104 shown in FIG. 1. That is, the woven mesh layers used to assemble the wick structure have the same overall shape, so as to facilitate assembly, but have fibers having different orientations.

Figure 5:
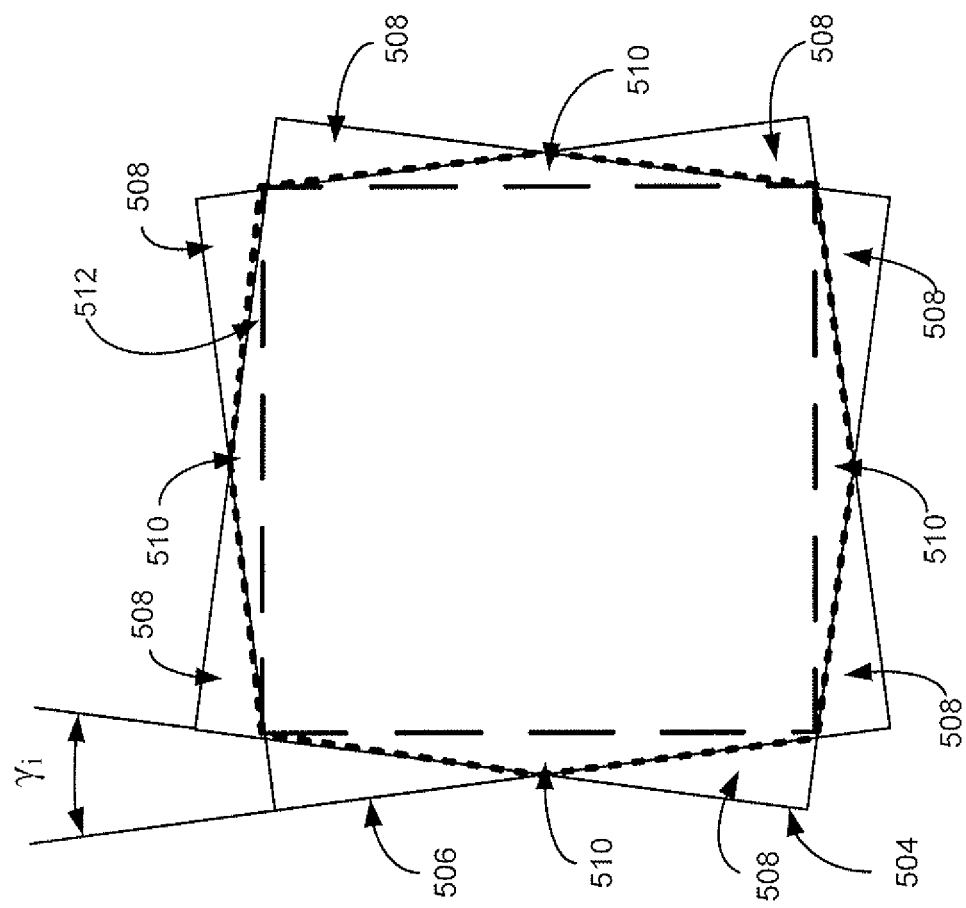
FIG. 5 conceptually illustrates a method for forming a two-layer wick structure in accordance with an embodiment of the invention.

In the general, weaving mesh material having fiber orientations at an offset angle is technologically difficult and involves additional cost. Therefore, in some embodiments of the invention, additional cost savings can achieved by fabricating the wick structure by combining pieces of similarly oriented woven mesh material. This is conceptually illustrated in FIG. 5. FIG. 5 conceptually illustrates a method for forming a two-layer wick structure in accordance with an embodiment of the invention. In particular, FIG. 5 conceptually illustrated how to form an area 502 usable for a wick structure from two sections of similarly oriented woven mesh material sections 504, 506 in accordance with an embodiment of the invention. For example, the sections 504, 506 can be two sections of same woven mesh material which normally having edges parallel or perpendicular to the warp direction of the woven mesh material.

First, the two sections 504, 506 are stacked so as to provide a desired offset angle ($\gamma_i$). Afterwards, non-overlapping areas 508 can be removed, leaving the two-layer wick structure 502. In some embodiments of the invention, additional areas can also be removed to facilitate handling or manufacturing. For example, as shown in FIG. 5, areas 510 can also be removed to provide rectangular area 512 instead of non-rectangular area 502. However, the invention is not limited in this regard. In the various embodiments of the invention, the shape and size of area 512 can be selected according to the application. Furthermore, although sections 504 and 506 are illustrated as similarly sized square-shaped sections, the invention is not limited in this regard. In other embodiments of the invention, the size and shape of sections 504 and 506 can be selected such that their overlap defines an area 502 of any shape and/or size.

Heat pipes including wick structures configured in accordance with one or more embodiments of the invention can be used in various applications, including commercial and industrial heating and cooling applications, power generation applications, and cooling applications for electronic devices, to name a few. For example, such heat pipes can be used in computer-based and other electronic systems, where increased power requirements and subsequent increases in heat emission have resulted in greater demands on cooling systems. In particular, heat pipes configured in accordance with an embodiment of the invention can be used in combination with heat sinks for electronic devices. Some exemplary configurations are shown in FIGS. 6A and 6B.

Figure 6A:
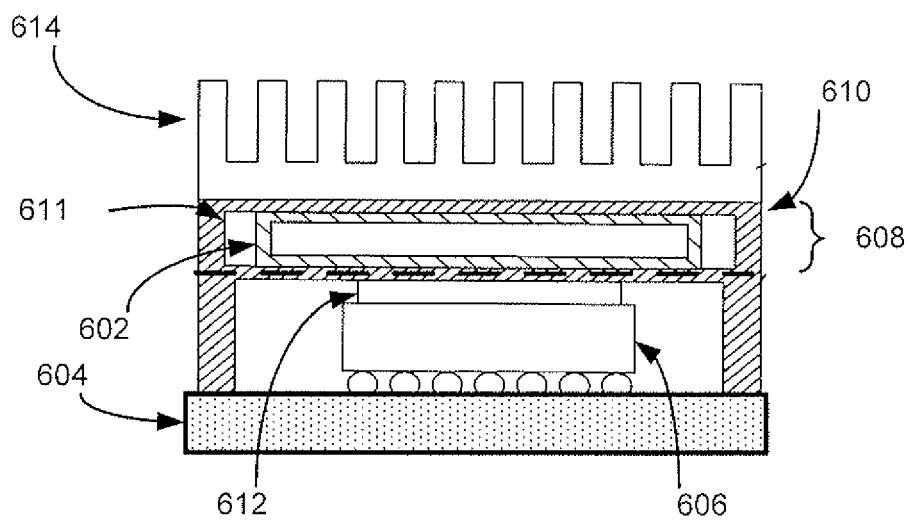
FIG. 6A shows a first exemplary configuration of an electronic device including a wick structure configured in accordance with an embodiment of the invention.

FIG. 6A shows a first exemplary configuration of an electronic device 600 including a wick structure 602 configured in accordance with an embodiment of the invention. As shown in FIG. 6A, the electronic device 600 can include a supporting substrate 604 for supporting electronic components, such as IC 606. In the exemplary configuration illustrated in FIG. 6, a heat pipe 608 is included as part of a lid substrate 610 for the IC 606. The lid substrate includes a cavity 611 having the wick structure 602 formed therein. Such a configuration is useful when the electronic component is not in substantial physical contact with the supporting substrate 604. For example, in the case of a flip-chip IC, such as IC 606 in FIG. 6 or soldered, free standing components. In such cases, the lid substrate 610 can be attached directly to a surface of the IC 606 or other electronic component via a thermally conductive adhesive or molding compound 612 to provide a thermally conductive contact between the IC 6064 and the lid substrate 610. The lid substrate 610 can also include a heat dissipating element 614, such as a heat sink, for directing heat from the heat pipe 608 into the surrounding environment. In operation, the IC 606 or other electronic component generates heat and the heat pipe 608 can direct heat to heat dissipating element 614, thus cooling the IC 606 without the need for significant electrical power. Although the heat pipe 608 is shown as a portion of lid substrate 610, the invention is not limited in this regard. In some embodiments of the invention, the lid substrate 610 can be formed without a heat pipe therein. Rather, the heat pipe 608 can be a separate component inserted between the heat dissipating element 614 and the lid substrate 610.

In some cases, it can be difficult placing a heat pipe in direct contact with an electronic component. For example, it can be difficult to contact oddly-shaped components or any other component configurations resulting in component surfaces that are difficult to access. In such configurations, a heat pipe in accordance with an embodiment of the invention can instead be formed in or on a supporting substrate or surface. This is shown in FIG. 6B.

Figure 6B:
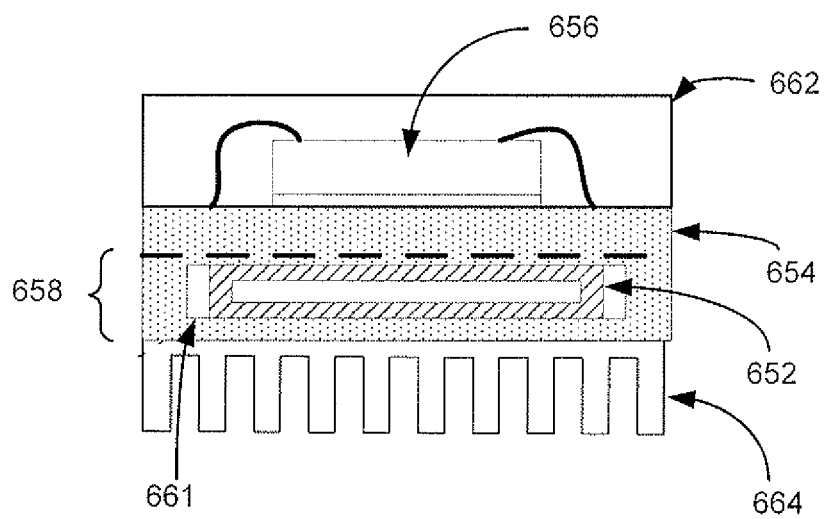
FIG. 6B shows a second exemplary configuration of an electronic device including a wick structure configured in accordance with an embodiment of the invention.

FIG. 6B shows a second exemplary configuration of an electronic device 650 including a wick structure 652 configured in accordance with an embodiment of the invention. As shown in FIG. 6B, the electronic device 650 can include a supporting substrate 654 for supporting electronic components, such as IC 656. In the exemplary configuration illustrated in FIG. 6, a heat pipe 658 is included as part of the supporting substrate 654. That is, the supporting substrate 654 includes a cavity 661 having a wick structure 652 formed therein in accordance with the various embodiments of the invention. Such a configuration can also useful when the electronic component is substantial physical contact with the supporting substrate 654. For example, in the case of IC 656 in FIG. 6, IC 656 is attached directly to substrate 654 via a thermally conductive adhesive or molding 662 to provide a thermally conductive contact between the IC 656 and the supporting substrate 654. The substrate 654 can also include a heat dissipating element 664, such as heat sink, for directing heat from the heat pipe 658 into the surrounding environment. In operation, as the IC 656 or other electronic component generates heat and the heat pipe 658 can direct heat to heat dissipating element 664, thus cooling the IC 656 without the need for significant electrical power. Although the heat pipe 658 is shown as a portion of supporting substrate 654, the invention is not limited in this regard. In some embodiments of the invention, the supporting substrate 654 can be formed without a heat pipe therein. Rather, the heat pipe 658 can be a separate component inserted between the heat dissipating element 614 and the supporting substrate 654.

Applicants present certain theoretical aspects above that are believed to be accurate that appear to explain observations made regarding embodiments of the invention based primarily on solid-state device theory. However, embodiments of the invention may be practiced without the theoretical aspects presented. Moreover, the theoretical aspects are presented with the understanding that Applicants do not seek to be bound by the theory presented.

While various embodiments of the invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A heat pipe, comprising:
a heat pipe body including at least one peripheral wall which circumscribes an inner cavity; and
a wick structure disposed in said inner cavity adjacent an interior surface defined by said peripheral wall and circumscribing an interior portion of said cavity, said wick structure comprising a first woven mesh layer and a second woven mesh layer disposed on said first woven mesh layer, said first and second woven mesh layers forming a stack extending from said interior surface of said peripheral wall,
wherein said first woven mesh layer comprises a first weave pattern of thermally conductive fibers having a first warp direction, wherein said second woven mesh layer comprises a second weave pattern of thermally conductive fibers having a second warp direction, and wherein said second woven mesh layer is disposed on said first woven mesh layer such that said first and said second warp directions are rotationally offset by a first inter-layer warp offset angle ($\gamma_i$) greater than 2.5 degrees and less than 87.5 degrees, and wherein said wick structure further comprises a third woven mesh layer disposed on said second woven mesh layer, wherein said third woven mesh layer comprises a third weave pattern of thermally conductive fibers having a third warp direction, and wherein said third woven mesh layer is disposed on said second woven mesh layer such that at least one of said first and said second warp directions are rotationally offset from said third warp direction by a second inter-layer warp offset angle ($\gamma_2$) greater than 2.5 degrees and less than 87.5 degrees, and wherein a relative magnitude difference between $\gamma_1$ and $\gamma_2$ is greater than 2.5 degrees.

2. The heat pipe of claim 1, wherein $\gamma_1$ is greater than 5 degrees and less than 85 degrees.

3. The heat pipe of claim 1, wherein $\gamma_1$ is greater than 40 degrees and less than 50 degrees.

4. The heat pipe of claim 1, wherein said first and said second weave patterns are the same.

5. The heat pipe of claim 1, wherein said first and said second weave patterns are different with respect to at least one characteristic selected from the group consisting of the way in which the thermally conductive fibers are positioned in relation to said first and second warp directions respectively, and how transverse thermally conductive fibers cross over and under the thermally conductive fibers in the first and second warp direction, respectively.

6. The heat pipe of claim 1, wherein at least a portion of said thermally conductive fibers in said first weave pattern and at least a portion of said thermally conductive fibers in said second weave pattern are different in at least one of size or composition.

7. The heat pipe of claim 1, wherein at least one of said second and said third weave patterns is different than said first weave pattern with respect to at least one characteristic selected from the group consisting of the way in which the thermally conductive fibers are positioned in relation to said first, second and third warp directions respectively, and how transverse thermally conductive fibers cross over and under the thermally conductive fibers in the said first, second and third warp direction, respectively.

* * * * *